United States Patent [19]

Yokokawa

[11] Patent Number: 5,110,654
[45] Date of Patent: May 5, 1992

[54] CERAMIC MULTILAYER WIRING SUBSTRATE

[75] Inventor: Sakae Yokokawa, Tokyo, Japan

[73] Assignee: NEC Corporation, Tokyo, Japan

[21] Appl. No.: 552,535

[22] Filed: Jul. 16, 1990

[30] Foreign Application Priority Data

Jul. 17, 1989 [JP] Japan ................... 1-182553

[51] Int. Cl.$^5$ .............................. B32B 3/10
[52] U.S. Cl. .................. 428/137; 428/209;
428/210; 428/195; 428/433; 428/457; 428/901;
174/255; 174/256; 174/257; 361/411
[58] Field of Search ............. 428/137, 901, 209, 426,
428/433, 457, 210, 195; 156/89, 901; 174/255,
256, 257; 361/414, 411

[56] References Cited

U.S. PATENT DOCUMENTS

| | | | |
|---|---|---|---|
| 4,650,923 | 3/1987 | Nishigaki | 174/256 |
| 4,712,161 | 12/1987 | Pryor | 174/256 |
| 4,724,283 | 2/1988 | Shimada | 174/257 |
| 4,871,608 | 10/1989 | Kondo | 428/901 |
| 4,984,132 | 1/1991 | Sakurai | 361/414 |

FOREIGN PATENT DOCUMENTS 244631 10/1987 Japan ................... 428/137

Primary Examiner—Ellis P. Robinson
Assistant Examiner—Nasser Ahmad
Attorney, Agent, or Firm—Burns, Doane, Swecker & Mathis

[57] ABSTRACT

A ceramic multilayer wiring substrate having a stack of a plurality of ceramic sheets each being formed with through holes which are connected to one another by a conductive paste buried in said through holes. Among the ceramic sheets, those which constitute an intermediate layer portion each is formed with a plurality of parallel through holes which are spaced apart in the direction perpendicular to the direction of thickness of the ceramic sheet. With such through holes, the substrate reduces the resistance in the intermediate layer portion and, therefore, the conduction resistance of the entire through holes.

3 Claims, 2 Drawing Sheets

CERAMIC MULTILAYER WIRING SUBSTRATE

BACKGROUND OF THE INVENTION

The present invention relates to a ceramic multilayer wiring substrate and, more particularly, to the structure of through holes which are formed in such a wiring substrate.

A ceramic multilayer wiring substrate is extensively used as a wiring substrate for various kinds of electronic equipment. This kind of wiring substrate has a plurality of ceramic green sheets which are connected in a laminate configuration. Though holes are formed one in each green sheet in alignment with one another and are filled with conductive paste. A particular wiring pattern is formed on the surface of each green sheet and connected to the through hole of the sheet. The wiring patterns on the nearby green sheets are connected to each other by the through holes.

In the above structure, all the through holes interconnecting the wiring patterns provided on the individual green sheets have the same configuration, so that the conduction resistance is undesirably high. To eliminate this problem, the through holes may each be provided with a larger diameter or, alternatively, a plurality of through holes may be assigned to each of expected purposes. However, with the larger diameter scheme, it often occurs that the amount of buried conductive paste is short or the paste slips off. Such occurrences would prevent the wiring substrate from achieving a desired resistance despite the larger through holes. The multiple through hole scheme is not practicable unless a land provided on the surface of the wiring substrate for interconnecting the through holes is increased in size, obstructing dense arrangement of circuit elements on the surface of the substrate.

SUMMARY OF THE INVENTION

It is therefore an object of the present invention to provide a reliable and high performance ceramic multilayer wiring substrate.

It is another object of the present invention to provide a ceramic multilayer wiring substrate which reduces the conduction resistance of through holes.

It is another object of the present invention to provide a generally improved ceramic multilayer wiring substrate.

In accordance with the present invention, a ceramic multilayer wiring substrate having a stack of a plurality of ceramic sheets each being formed with through holes which are connected to one another by conductive paste buried therein comprises a plurality of parallel first through holes formed in each of the ceramic sheets which constitute an intermediate layer portion, and spaced apart in a direction perpendicular to a direction of thickness of the ceramic sheet, a single second through hole formed in each of the ceramic sheets which constitute surface layer portions between which the intermediate layer portion is interposed, and a relaying land for connecting the single second through hole to the plurality of parallel first through holes.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1:
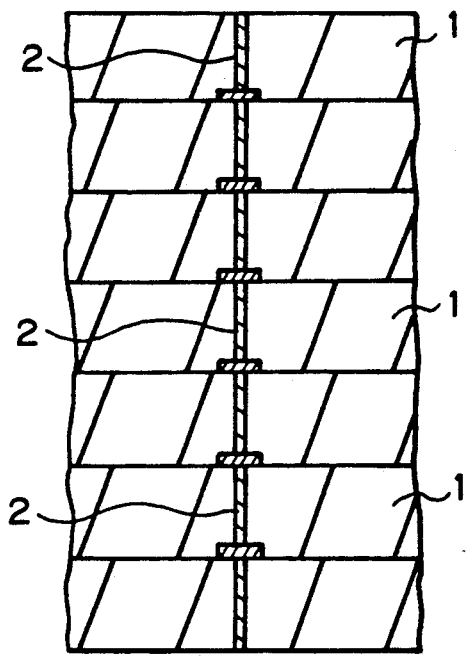
FIG. 1 is a section showing a prior art ceramic multilayer wiring substrate.

To better understand the present invention, a brief reference will be made to a prior art ceramic multilayer wiring substrate, shown in FIG. 1. As shown, the prior art wiring substrate has a stack of ceramic green sheets 1 each being provided with a through hole 2 and a particular wiring pattern, not shown. The through hole 2 is filled with conductive paste and is connected to the associated wiring pattern. The wiring patterns on the nearby green sheets 1 are connected to each other by the through holes 2. To fabricate such a multilayer wiring substrate, the through holes 2 are formed in the individual green sheets 1 before the latter is stacked. Then, conductive paste is buried in the through holes 2 of the green sheets 1 by thick film printing which per se is known in the art, while a particular wiring pattern is formed on the surface of each green sheet 1. The green sheets 1 with the holes 2 and wiring patterns are stacked and then united in a laminate by heat pressing which is also known in the art. Finally, the laminate is fired to remove a binder therefrom.

Figure 2:
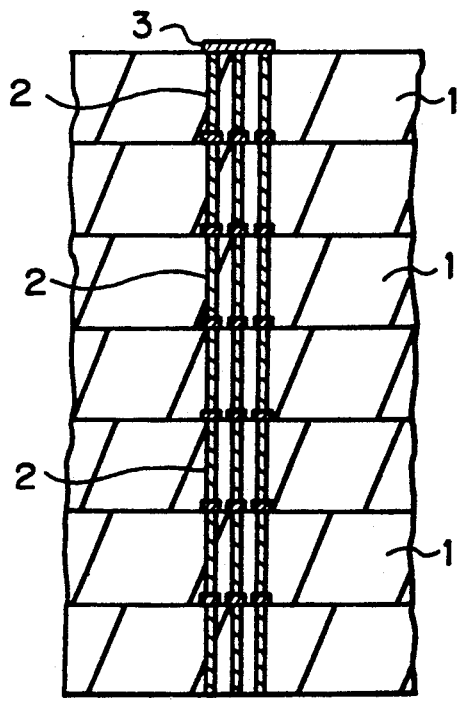
FIG. 2 is a section showing another prior art ceramic multilayer wiring substrate having a plurality of parallel through holes.

In the above structure, all the through holes 2 interconnecting the wiring patterns provided on the individual green sheets 1 have the same configuration, so that the conduction resistance thereof is undesirably high, as stated earlier. To eliminate this problem, it has been customary to increase the diameter of the through holes 2 or, as shown in FIG. 2, to provide a plurality of through holes 2 for each of different purposes. Specifically, in the configuration of FIG. 2, a plurality of parallel through holes 2 are formed side by side in each green sheet 1. However, with the larger diameter scheme, it often occurs that the amount of buried conductive paste is short or the paste slips off during the thick film printing operation. Such occurrences would prevent the wiring substrate from achieving a desired resistance despite the larger through holes 2. The multiple through hole scheme shown in FIG. 2 is not practicable unless a land 3 provided on the surface of the wiring substrate for interconnecting the through holes 2 is increased in size, preventing circuit elements from being densely arranged on the surface of the substrate.

Figure 3:
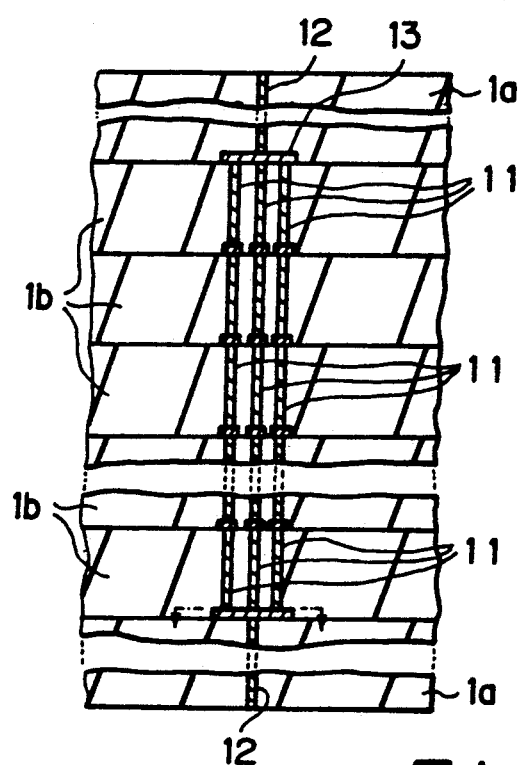
FIG. 3 is a section showing a ceramic multilayer wiring substrate embodying the present invention.
Figure 4:
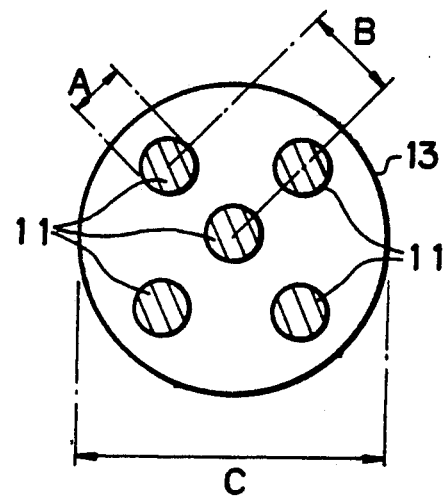
FIG. 4 is a section along line IV—IV of FIG. 3.

Referring to FIGS. 3 and 4, a ceramic multilayer wiring substrate embodying the present invention is shown. In the figures, similar components and structural elements are designated by the same reference numerals, and redundant description will be avoided for simplicity. It is to be noted that specific numerical values which will be mentioned are the values measured before the substrate is fired and usually decrease by 11 to 13 percent due to contraction after firing.

As shown in FIGS. 3 and 4, the wiring substrate has a plurality of ceramic green sheets stacked one upon another, i.e., green sheets 1a constituting opposite surface layer portions and green sheets 1b constituting an intermediate layer portion. The intermediate green sheets 1b each is formed with first parallel through holes 11 which are spaced apart in the direction perpendicular to the direction of thickness of the green sheet. As shown in FIG. 4, five such through holes 11 are formed in each green sheet 1b, and each has a diameter A which is substantially the same as the diameter of the prior art through hole, i.e. 0.25 millimeter. Those through holes 11 which are located nearest to each other are spaced apart by a distance B which is selected to be 0.67 millimeter. The green sheets 1a constituting the surface layer portions each is provided with a single second through hole 12. Each of the second through holes 12 is connected to the first through holes 11 by a transfer land 13 which serves as a relaying land and will be described later specifically. As shown in FIG. 4, the transfer lands 13 are circular as viewed in a plan view, and each has a diameter of 2.0 millimeters so as to be connected to all of the five through holes 11.

The ceramic multilayer wiring substate having the above structure is fabricated by the following procedure.

First, the individual ceramic green sheets 1a and 1b are produced. Specifically, aluminum powder and a binder for solidification are dissolved in an organic solvent to prepare slurry, an then the slurry is casted by a doctor blade to form a film. The resulting green sheets 1a and 1b are 0.1 millimeter thick and about 150 millimeter square each. Subsequently, through holes are formed in the green sheets 1a and 1b. The number of through holes formed in the green sheets 1a and 1b is about 2,000 in total. Among them, about 1,000 through holes assigned to signals, each is implemented as the conventional single through hole 2, FIG. 2, while about 1,000 other through holes adapted for power supply and ground are implemented as the through holes 11 formed in the intermediate green sheets 1b, FIGS. 3 and 4. Thereafter, conductive paste is buried in the through holes by thick film printing and, at the same time, a predetermined wiring pattern is provided on the sheet surface. In the illustrative embodiment, the conductive paste is implemented by tungsten (W). It is noteworthy that the conductive paste is readily buried in the through holes because the diameter of each hole is as small as that of the prior art, i.e. 0.25 millimeter. At this stage of fabrication, the transfer lands 13 are printed on the individual intermediate green sheets 1b. The green sheets 1a and 1b selectively provided with the first through holes 11, second through holes 12, transfer lands 13 and wiring patterns as stated above are stacked together by a jig, not shown. In the illustrative embodiment, the wiring substrate has thirty intermediate green sheets 1b, five upper green sheets 1a, and five lower green sheets 1a. The stack of green sheets 1a and 1b is united together by heat pressing to form a laminate. The heat pressing is effected at 100 degrees centigrade for about 1 hour and by applying a pressure of 150 kilograms per square centimeter. The resulting wiring substrate is about 3.5 millimeter thick. Finally, the laminate is fired to remove the binder therefrom.

Experiments showed that the through holes of the ceramic multilayer wiring substrate fabricated by the above procedure have a conduction resistance of 6.5 milliohms. It will therefore be seen that the through hole configuration of the illustrative embodiment considerably reduces the resistance without resorting to a larger diameter, compared to the prior art single though hole type configuration, FIG. 1, whose resistance is 14.0 milliohms.

Figure 5:
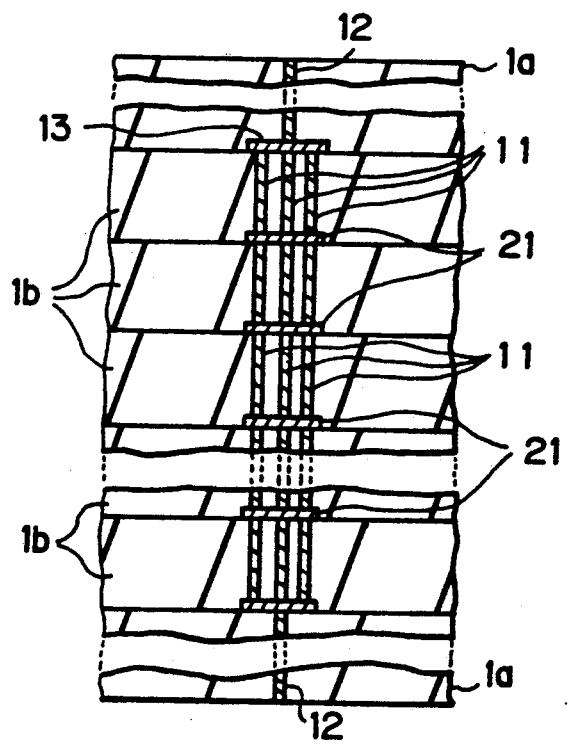
FIG. 5 is a section showing a modification of the illustrative embodiment.

In the illustrative embodiment, the first through holes formed in each green sheet 1b are not electrically connected to one another. Alternatively, as shown in FIG. 5, they may be electrically connected within the green sheet 1b by a connecting land 21. Specifically, in FIG. 5, the connecting land 21 is printed on all the intermediate ceramic green sheets 1b in the same pattern as the transfer lands 13. When the plurality of first through holes 11 are connected together in the configuration shown in FIGS. 3 and 4, they are susceptible to dislocation which is apt to occur during the course of stacking; should any of the green sheets 1b be dislocated even a little relative to the others, the current expected to flow between the through holes 11 would not be constant and would thereby bring about incomplete conduction. In contrast, the alternative configuration of FIG. 5 surely maintains the through holes 11 in connection with the connecting lands 21 even when any of the green sheets 1b has been dislocated. In addition, the connecting lands 21 serve to reduce the conduction resistance of the through holes to 3.9 milliohms which is even lower than the resistance achievable with the previous embodiment.

In summary, it will be seen that the present invention provides a reliable and high performance ceramic multilayer wiring substrate. Specifically, the resistance of through holes in intermediate layers is reduced to allow conductive paste to be surely buried in the through holes, while the conduction resistance of the entire through holes is reduced without effecting the dense arrangement of circuit elements on the surface of the substrate.

Various modifications will become possible for those skilled in the art after receiving the teachings of the present disclosure without departing from the scope thereof.

What is claimed is:

1. A ceramic multilayer wiring substrate having a stack of a plurality of ceramic sheets each being formed with through holes, which are connected to one another by conductive paste buried in said through holes, comprising:

a plurality of parallel first through holes formed in each of the ceramic sheets which constitute an intermediate layer portion, and spaced apart in a direction perpendicular to a direction of thickness of said ceramic sheet;

a single second through hole formed in each of the ceramic sheets which constitute surface layer portions between which the intermediate layer portion is interposed; and a relaying land for connecting said single second through hole to said plurality of parallel first through holes.

2. A wiring substrate as claimed in claim 1, further comprising a connecting land for connecting said plurality of parallel first through holes to one another.

3. A wiring substrate as claimed in claim 2, wherein said relaying land and said connecting land are printed on said ceramic sheets constituting the intermediate layer potion.

* * * * *